United States Patent
Zhou et al.

(10) Patent No.: US 11,169,236 B2
(45) Date of Patent: Nov. 9, 2021

(54) PHASE CORRECTION FOR ECHO-PLANAR IMAGING

(71) Applicant: The General Hospital Corporation, Boston, MA (US)

(72) Inventors: Kun Zhou, Shenzhen (CN); Wei Liu, Shenzhen (CN); Yulin Chang, Watertown, MA (US); Uvo Hölscher, Erlangen (DE); William Scott Hoge, Watertown, MA (US); Jonathan Rizzo Polimeni, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 243 days.

(21) Appl. No.: 16/571,316

(22) Filed: Sep. 16, 2019

(65) Prior Publication Data

US 2020/0326398 A1 Oct. 15, 2020

Related U.S. Application Data

(60) Provisional application No. 62/831,774, filed on Apr. 10, 2019.

(51) Int. Cl.
*G01R 33/561* (2006.01)
*G01R 33/565* (2006.01)
*G01R 33/48* (2006.01)

(52) U.S. Cl.
CPC ..... *G01R 33/5618* (2013.01); *G01R 33/4818* (2013.01); *G01R 33/56545* (2013.01); *G01R 33/56554* (2013.01)

(58) Field of Classification Search
CPC .......... G01R 33/5618; G01R 33/56545; G01R 33/56554; G01R 33/4818; G01R 33/5616; G01R 33/5611

(Continued)

(56) References Cited

U.S. PATENT DOCUMENTS 6,307,369 B1 * 10/2001 Felmlee ........... G01R 33/56509
324/307
8,497,681 B2 7/2013 Feiweier
(Continued)

FOREIGN PATENT DOCUMENTS

WO 2016032823 A1 3/2016

OTHER PUBLICATIONS

Zhu, Kangrong, et al. "Hybrid-space SENSE reconstruction for simultaneous multi-slice MRI." IEEE transactions on medical imaging 35.8 (2016): 1824-1836. (Year: 2016).*

(Continued)

*Primary Examiner* — Christopher P McAndrew

(57) ABSTRACT

Systems and methods include conversion of a first frame of k-space data acquired using a first initial readout polarity to first hybrid ($k_x$, y)-space data, conversion of a second frame of k-space data acquired using a second initial readout polarity to second hybrid ($k_x$, y)-space data, determination of a relationship between phase difference and y-position based on phase differences between a plurality of pixels located at $k_x$=a of first hybrid ($k_x$, y)-space data and a plurality of pixels at $k_x$=b of second hybrid ($k_x$, y)-space data, where a and b are constants, modification of the second hybrid ($k_x$, y)-space data based on the relationship, conversion of the modified second hybrid ($k_x$, y)-space data to a modified second frame of k-space data, generation of two single-polarity readout k-space frames based on the first frame of k-space data and the modified second frame of k-space data, and correction of a third frame of EPI image data based on the two single-readout polarity k-space frames.

20 Claims, 8 Drawing Sheets

(58) Field of Classification Search
USPC .......................................................... 324/309
See application file for complete search history.

(56) References Cited

U.S. PATENT DOCUMENTS

| | | | | |
|---|---|---|---|---|
| 2006/0241390 | A1* | 10/2006 | Kruger | G01R 33/56375 600/420 |
| 2012/0008842 | A1* | 1/2012 | Hinks | G01R 33/56554 382/131 |
| 2017/0276755 | A1* | 9/2017 | Hoge | G01R 33/5616 |

OTHER PUBLICATIONS

Gaur, Pooja, et al. "Spatially-segmented undersampled MRI temperature reconstruction for transcranial MR-guided focused ultrasound." Journal of therapeutic ultrasound 5.1 (2017): 1-11. (Year: 2017).*

Santelli, Claudio. Accelerating Multi-dimensional Magnetic Resonance Imaging of Blood Flow and Turbulence in the Cardiovascular System. Diss. Guy's, King's and St. Thomas's School of Medicine, 2015. (Year: 2015).*

Ahn, C. B., et al. "A New Phase Correction Method in NMR Imaging Based on Autocorrelation and Histogram Analysis", IEEE Transaction on Medical Imaging, vol. MI-6, No. 1, Mar. 1987, 5 pages.

Bruder, H, et al. "Image Reconstruction for Echo Planar Imaging with Nonequidistant k-Space Sampling,", 1992, Magnetic Resonance in Medicine, 1992, 39:606-614, 13 pages.

Jesmanowicz A, et al. "Phase correction for EPI Using Internal Reference Lines", Proceedings of the Society for Magnetic Resonance in Medicine, 1993, p. 1239, 1 page.

Hu, Xiaoping, et al. "Artifact Reduction in EPI With Phase-Encoded Reference Scan", Magnetic Resonance in Medicine, 1996, 36:166-171, 6 pages.

Buonocore MH, et al. "Ghost Artifact Reduction for Echo Planar Imaging Using Image Phase Correction," Magnetic Resonance in Medicine, 1997, 38:89-100, 12 pages.

Grieve, Stuart M. et al. "Elimination of Nyquist Ghosting Caused by Read-Out to Phase-Encode Gradient Cross-Terms in EPI", Magnetic Resonance in Medicine, 2002, 47:337-343, 7 pages.

Zhou, Xiahong Joe, et al. "Concomitant Magnetic-Field-Induced Artifacts in Axial Echo Planar Imaging", Magnetic Resonance in Medicine, 1998, 39:596-605, 10 pages.

Chen NK, et al. Removal of EPI Nyquist Ghost Artifacts With Two-Dimensional Phase Correction, Magnetic Resonance in Medicine, 2004, 51:1247-1253, 7 pages.

Xiang Qing-Sang, et al. "Correction for Geometric Distortion and N/2 Ghosting in EPI by Phase Labeling for Additional Coordinate Encoding (PLACE)", Magnetic Resonance in Medicine, 2007, 57:731-741, 11 pages.

Hoge W. Scott, et al. "Robust EPI Nyquist Ghost Elimination via Spatial and Temporal Encoding", Magnetic Resonance in Medicine, 2010, 64:1781-1791, 11 pages.

Hoge W. Scott, et al. "Dual-Polarity GRAPPA for Simultaneous Reconstruction and Ghost Correction of Echo Planar Imaging Data", Magnetic Resonance in Medicine, 2016, 76:32-44, 32 pages.

Hoge W. Scott, et al. "Dual-Polarity GRAPPA for Simultaneous Reconstruction and Ghost Correction and slice separation in simultaneous multi-slice EPI", Magnetic Resonance in Medicine, 2018, DOI: 10.1002.mrm.27113, 12 pages.

* cited by examiner

PHASE CORRECTION FOR ECHO-PLANAR IMAGING

CROSS-REFERENCE TO RELATED APPLICATIONS

The present application claims priority to U.S. Provisional Patent Application No. 62/831,774, filed Apr. 10, 2019, the contents of which are incorporated by reference herein for all purposes.

BACKGROUND

A Magnetic Resonance (MR) scanner generates images of patient anatomy based on sequences of RF pulses. Echo-planar imaging (EPI) is a type of MR imaging which provides high-speed image acquisition. Due to its high speed (e.g., acquisition of an entire image within tens of milliseconds), EPI is often used to obtain images for neuroscientific study.

The high speed of EPI is enabled by rapid switching of a magnetic field gradient to reverse k-space trajectories, and prolonged echo trains. The rapid gradient switching may lead to inconsistencies between odd and even lines of k-space, resulting in a so-called Nyquist ghost in images reconstructed therefrom.

Some techniques for Nyquist ghost correction require two reference EPI scans (i.e., k-space datasets) with opposite readout polarities. The two k-space datasets are used to form two synthesized k-space frames, each of which consists of data acquired from only a single readout polarity (RO+ or RO−). The two synthesized k-space frames are then used to perform Nyquist ghost correction on a later-acquired imaging scan. The synthesized k-space frames must themselves be artifact-free in order to properly inform the ghost correction process. However, in certain scenarios such as but not limited to diffusion EPI, the synthesized k-space frames often include artifacts.

Systems are desired for efficiently reducing artifacts within single-polarity k-space images synthesized from two EPI acquisitions with opposite readout polarities.

DETAILED DESCRIPTION

The following description is provided to enable any person in the art to make and use the described embodiments. Various modifications, however, will remain readily apparent to those in the art.

Some embodiments provide efficient correction of phase inconsistency between two EPI reference frames with opposite readout polarities. Generally, and as will be described in detail below, embodiments may convert each of the two EPI reference frames to image-space, identify a pair of image pixels in the converted images which correspond to a pair of k-space pixels to be spatially aligned in k-space (e.g., pixels located at $k_x$=0 and on the first k-space line of each reference frame), and determine a phase difference between the image data of the pair of image pixels. This identification and determination then repeats for pairs of k-space pixels located on other k-space lines of each reference frame.

A linear (or other polynomial) relationship is determined between the phase differences and $k_y$ locations of the pixel pairs. The relationship is then used to correct the phase of all the image data of one of the converted images. The corrected image is then converted back to k-space, resulting in two EPI reference frames with opposite readout polarities and spatially-aligned k-space lines. One or both of the EPI reference frames may then be used for ghost-correction of EPI image data as is known in the art.

Figure 1:
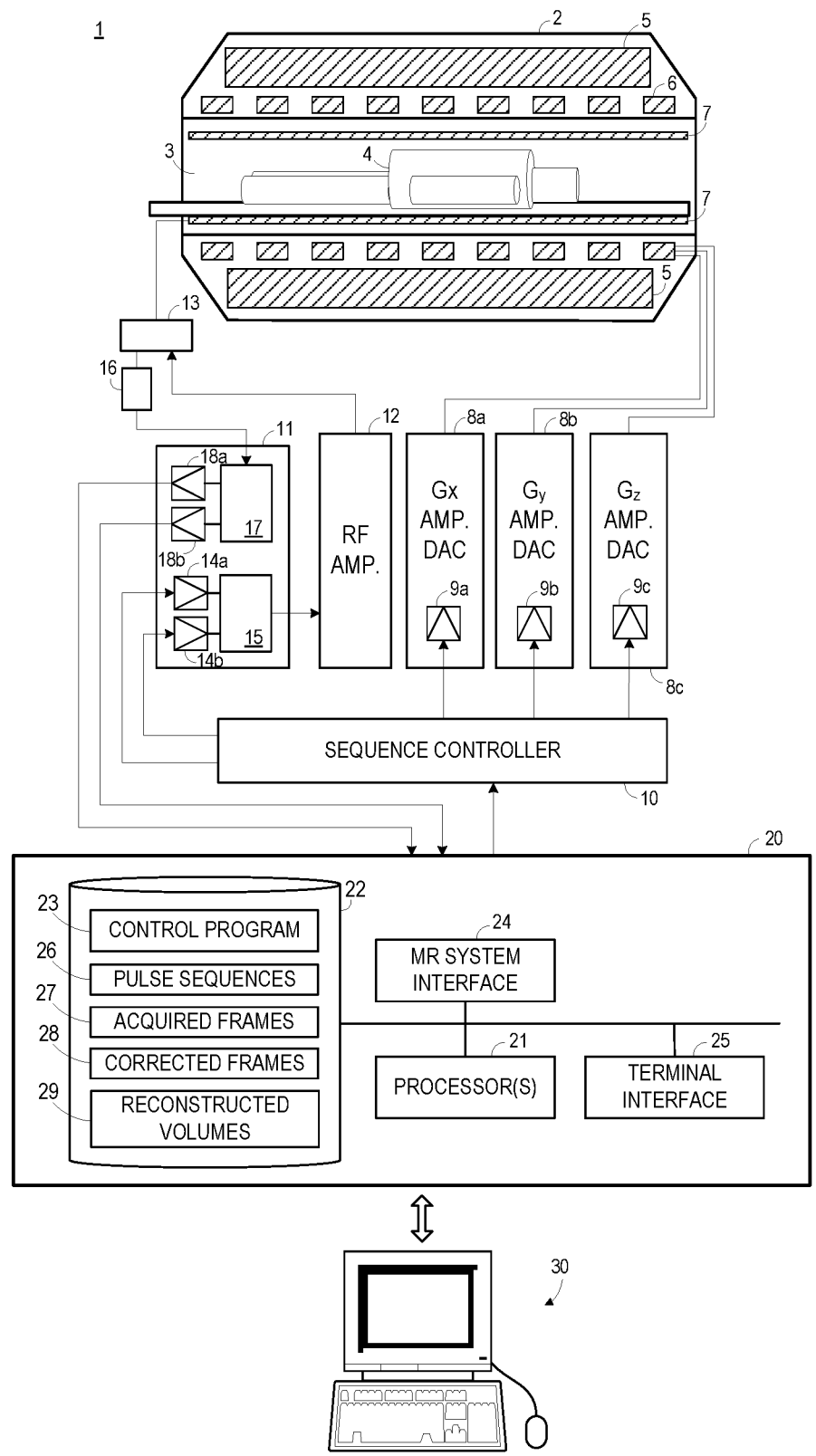
FIG. 1 is a block diagram of an MR system according to some embodiments.

FIG. 1 illustrates MR system 1 according to some embodiments. MR system 1 includes MR chassis 2, which defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MR techniques, a substance (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly-oriented magnetic components in the perpendicular plane (the x-y plane) cancel out one another.

The substance is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated and signals are emitted by the excited spins as they return to their pre-excitation field state. The emitted signals are detected, digitized and processed to reconstruct an image using one of many well-known MR reconstruction techniques.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of precessing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into real and imaginary components.

Computing system 20 receives the real and imaginary components from analog-digital converters 18a and 18b and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random access memory, and/or removable media (e.g., a thumb drive) mounted in a corresponding interface (e.g., a USB port).

Storage device 22 stores program code of control program 23. One or more processing units 21 may execute control program 23 to provide instructions to sequence controller 10 via MR system interface 24. For example, sequence controller 10 may be instructed to initiate a desired pulse sequence of pulse sequences 26. In particular, sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting MR signals.

One or more processing units 21 may execute control program 23 to acquire two EPI reference frames 27 based on pulse sequences 26 and align reference frames 27 in k-space as described herein to generate corrected frames 28. One or more processing units 21 may further execute control program 23 to acquire EPI image data and apply ghost correction to the EPI image data using known processes which incorporate one or both of the aligned reference EPI frames and result in reconstructed volumes 29.

Acquired images 27, corrected frames 28 and/or reconstructed volumes 29 may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to initiate EPI reference imaging sequence, and to initiate a standard EPI imaging sequence to acquire image data of a subject. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Figure 2A:
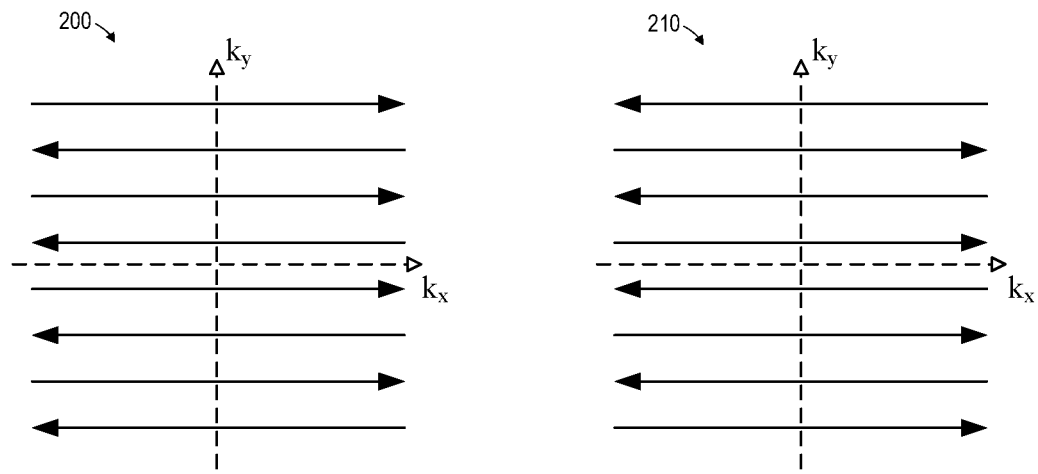
FIG. 2A represents k-space data sets with opposite readout polarities.

FIG. 2A represents EPI reference k-space data sets with opposite readout polarities. As will be described in more detail below, k-space data sets 200 and 210 may be acquired using EPI imaging sequences in which the first k-space line of data set 200 is acquired from left to right (i.e., in k-space) and the first k-space line of data set 210 is acquired from right to left (i.e., in k-space). The first k-space line of data set 200 is therefore associated with an RO+ readout polarity while the first k-space line of data set 210 is associated with an RO− readout polarity.

EPI reference k-space data sets 200 and 210 are substantially aligned. In this regard, the $k_y$ coordinate of the first k-space line of data set 200 is substantially equal to the $k_y$ coordinate of the first k-space line of data set 210. Similarly, the $k_y$ coordinate of the n-th k-space line of data set 200 is substantially equal to the $k_y$ coordinate of the n-th k-space line of data set 210. As used herein, two EPI reference data sets are considered substantially aligned if suitable ghost correction is achieved by subsequent processes which utilize one or both of the substantially-aligned data sets.

Figure 2B:
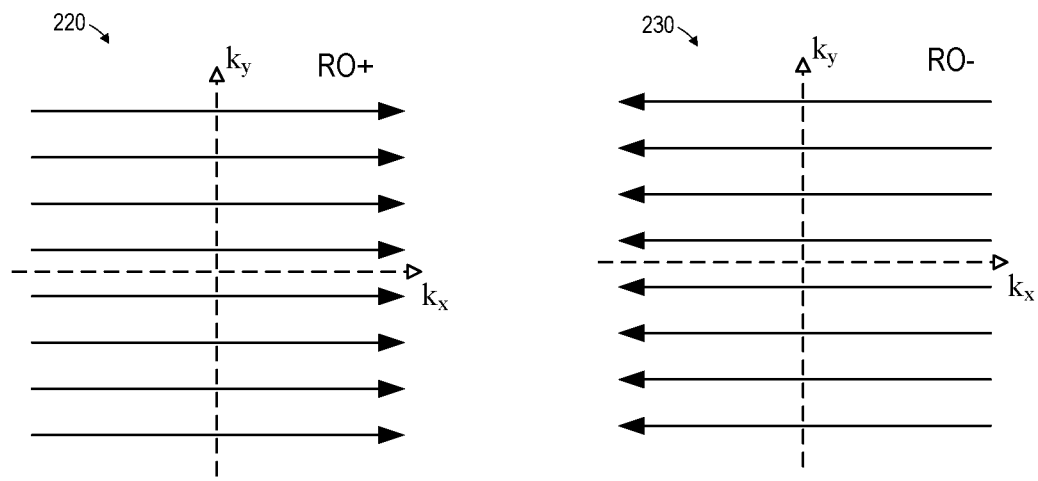
FIG. 2B represents synthesized k-space frames including data of the FIG. 2A k-space data set acquired from a single readout polarity.

For example, some embodiments synthesize two single-readout polarity frames based on substantially-aligned data sets. Frames 220 and 230 of FIG. 2B may be synthesized based on data sets 200 and 210. As shown, frame 220 includes the k-space lines of data sets 200 and 210 which were acquired using an RO+ readout polarity, and frame 230 includes the k-space lines of data sets 200 and 210 which were acquired using an RO− readout polarity. Notably, and due to the alignment of data sets 200 and 210, the (k-space) distance between each scan line of frames 220 and 230 is substantially equal, thereby providing suitable k-space data for subsequent ghost correction processes.

For example, and according to some embodiments, frames 220 and 230 can be used to generate optimized k-space frames using Ghost Elimination via Spatial and Temporal Encoding (GESTE) as is known in the art. The optimized k-space frames may in turn be used as parallel-imaging calibration targets in dual-polarity GeneRalized Autocalibrating Partially Parallel Acquisitions (GRAPPA) reconstruction. Embodiments are not limited to use in conjunction with GESTE and/or dual-polarity GRAPPA.

Figure 3A:
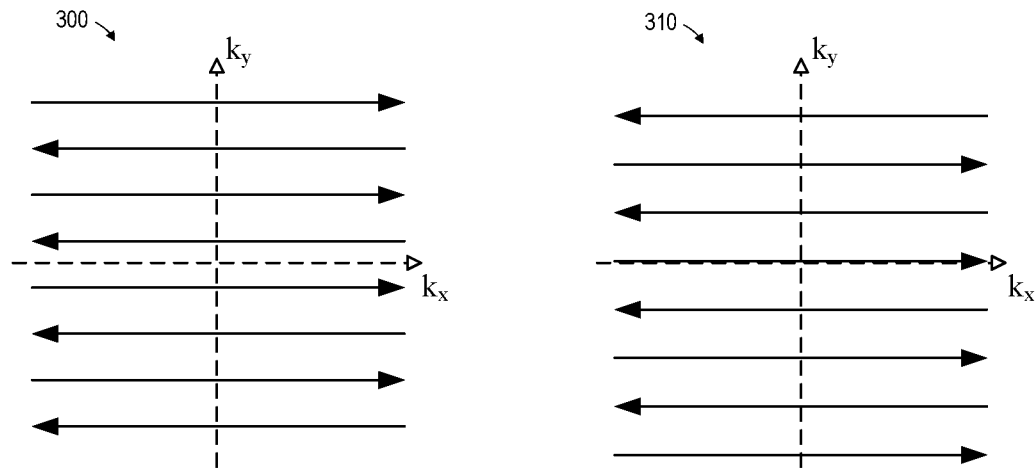
FIG. 3A represents k-space data sets with opposite readout polarities.

FIG. 3A represents EPI reference k-space data sets 300 and 310 with opposite readout polarities. Unlike data sets 200 and 210 of FIG. 2A, EPI reference k-space data sets 300 and 310 exhibit an offset along the $k_y$ axis. In particular, the $k_y$ coordinate of the first k-space line of data set 300 is offset from the $k_y$ coordinate of the first k-space line of data set 310. Similarly, and to various degrees, the $k_y$ coordinate of the n-th k-space line of data set 300 is offset from the $k_y$ coordinate of the n-th k-space line of data set 310.

Figure 3B:
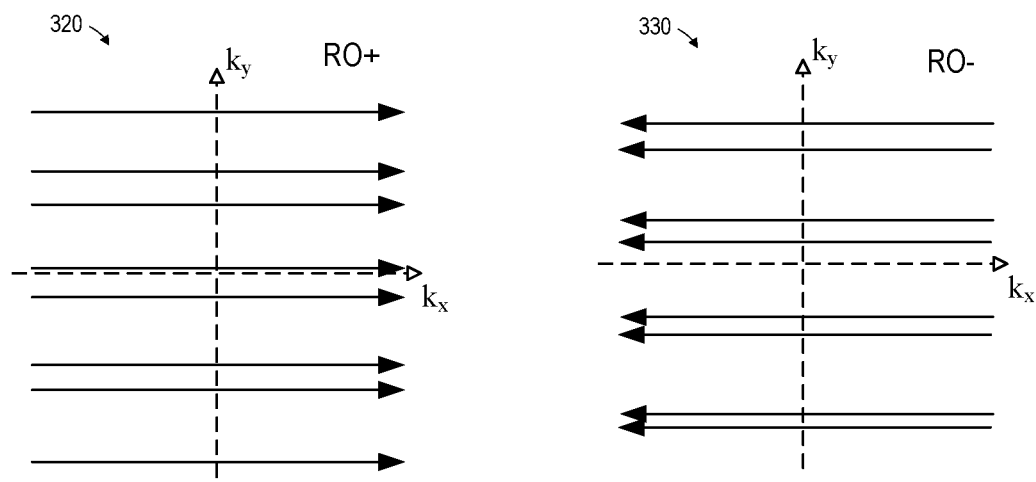
FIG. 3B represents synthesized k-space frames including data of the FIG. 3A k-space data set acquired from a single readout polarity.

Single-readout polarity frames 320 and 330 of FIG. 3B have been synthesized based on data sets 200 and 210. Specifically, frame 320 includes the k-space lines of data sets 300 and 310 which were acquired using an RO+ readout polarity, and frame 330 includes the k-space lines of data sets 300 and 310 which were acquired using an RO− readout polarity. Due to the mis-alignment of data sets 300 and 310, the (k-space) distances between the scan lines of frame 320 and the scan lines of frame 330 are substantially unequal. Accordingly, single-readout polarity frames 320 and 330 are unsuitable for use in subsequent ghost correction.

Some embodiments operate to align an EPI reference k-space data set such as data set 310 with an opposite-readout polarity EPI reference k-space data set such as data set 300. Consequently, some embodiments allow synthesis of two optimized single-polarity k-space frames from two mis-aligned EPI reference k-space data sets.

Figure 4:
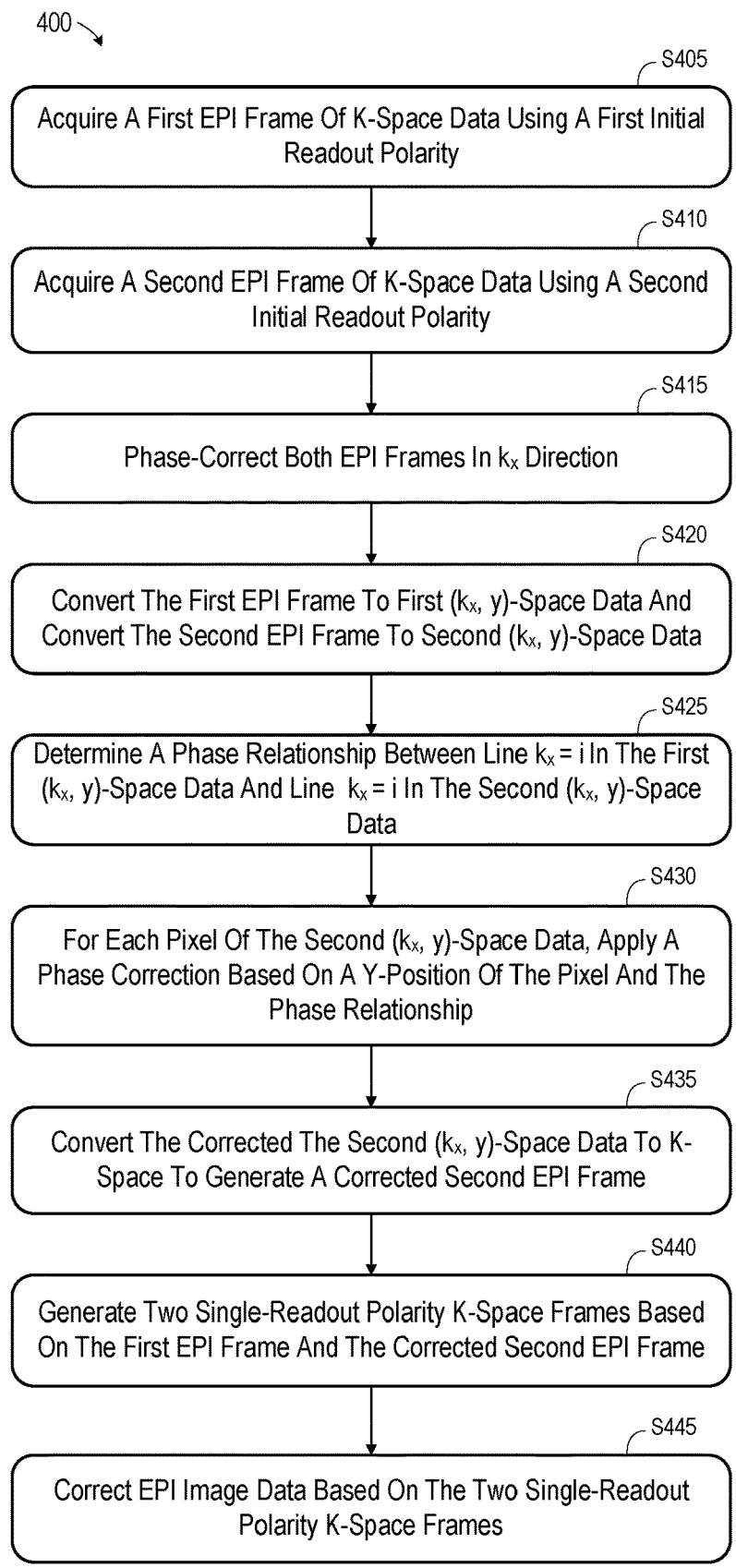
FIG. 4 comprises a flow diagram of a process to synthesize two single-polarity k-space frames from two k-space data sets with opposite readout polarities according to some embodiments.

FIGS. 4A and 4B comprise a flow diagram of a process to synthesize two single-polarity k-space frames from two k-space data sets with opposite readout polarities according to some embodiments. In some embodiments, various hardware elements of system 1 (e.g., one or more processors) execute program code to perform process 400. The steps of process 400 need not be performed by a single device or system, nor temporally adjacent to one another.

Process 400 and all other processes mentioned herein may be embodied in processor-executable program code read from one or more of non-transitory computer-readable media, such as a disk-based or solid-state hard drive, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at S405, a first EPI frame of k-space data is acquired using a first initial readout polarity. As is known, EPI acquires multiple k-space lines after each RF excitation. This acquisition may significantly reduce acquisition time in comparison to other imaging sequences.

Figure 5A:
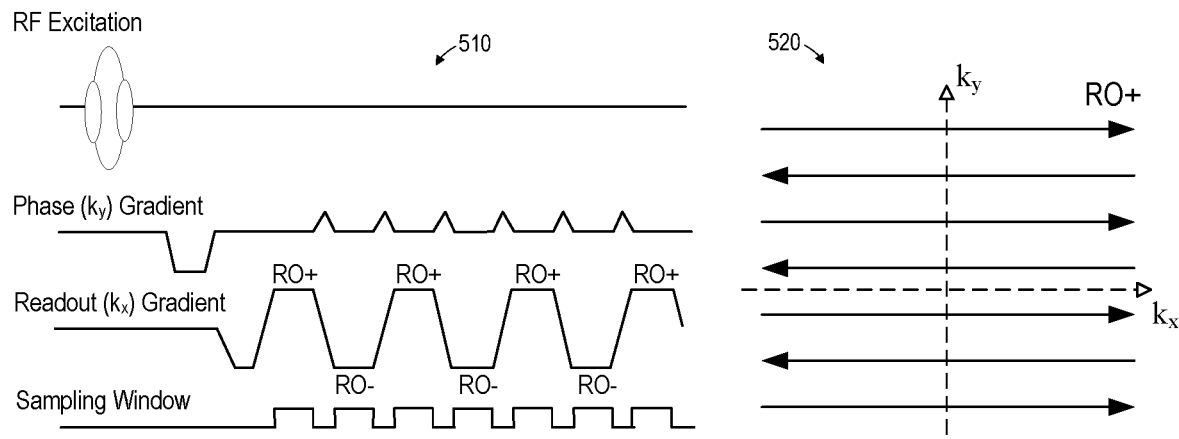
FIG. 5A illustrates an EPI sequence to acquire a first EPI frame of k-space data using a first initial readout polarity according to some embodiments.

FIG. 5A illustrates EPI imaging sequence 510 which may be executed at S405 according to some embodiments, along with EPI frame of k-space data 520 acquired thereby. As shown by sequence 510 and data 520, the first acquired k-space line is acquired using an initial RO+ readout polarity. As also shown, and by virtue of the readout ($k_x$) gradient signal, each subsequently-acquired scan line of data 520 is of an alternating readout polarity.

A second EPI frame of k-space data is acquired at S410 using a second initial readout polarity. The second initial readout polarity is opposite to the first initial readout polarity used to acquire the first EPI frame of k-space data at S405.

Figure 5B:
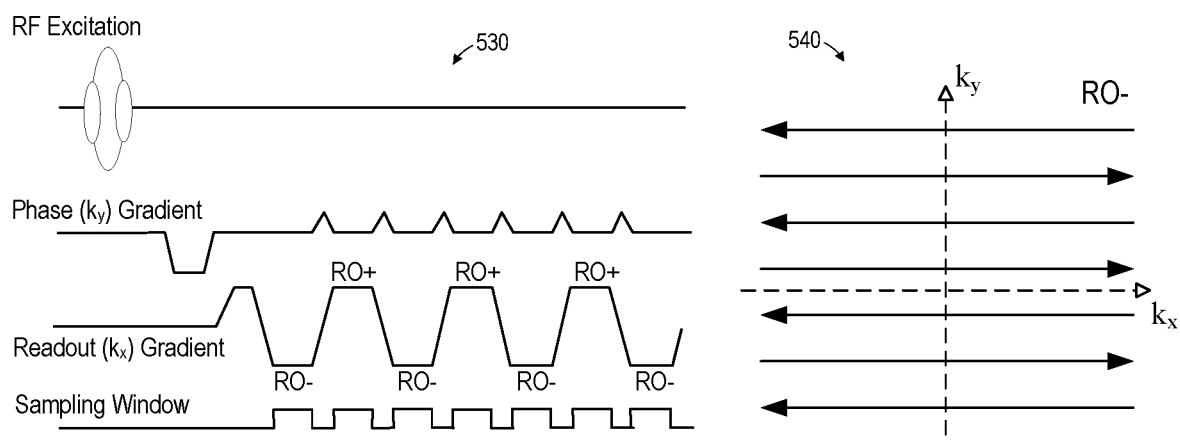
FIG. 5B illustrates an EPI sequence to acquire a second EPI frame of k-space data using a second initial readout polarity according to some embodiments.

FIG. 5B illustrates EPI imaging sequence 530 which may be executed at S410 according to some embodiments. EPI imaging sequence 530 results in acquisition of EPI frame of k-space data 540. The first line of k-space data 540 is acquired using an RO− readout polarity, and each subsequent scan line of data 540 is acquired using an alternating readout polarity. k-space data 520 and k-space data 540 therefore exhibit opposite readout polarities. Embodiments are not limited to the examples of FIGS. 5A and 5B.

At S415, each of the acquired EPI frames is phase-corrected so that each scan line of an EPI frame is aligned with each other scan line along the $k_x$ direction. Within each EPI frame, the correction at S415 results in the beginning of each RO+ line being located at a same $k_x$ position as the end of each RO− line, and the beginning of each RO− line being located at a same $k_x$ position as the end of each RO+ line. Techniques for such intra-frame correction are known in the art.

At S420, the first EPI frame of k-space data is converted to first hybrid ($k_x$, y)-space data and the second EPI frame of k-space data is converted to second hybrid ($k_x$, y)-space data. S420 may comprise applying a Fourier transform to each EPI frame along $k_y$.

Figure 6A:
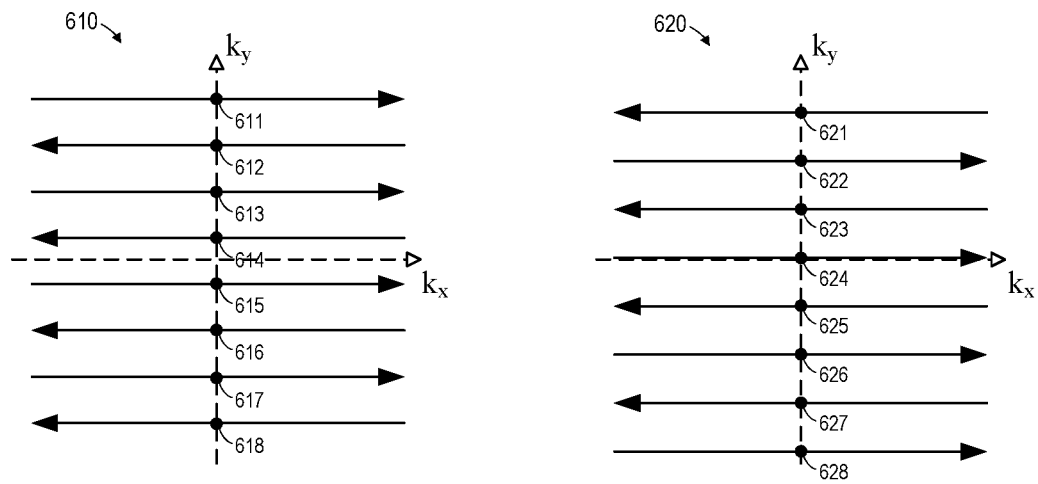
FIG. 6A represents reference frames of k-space data with opposite readout polarity.

FIG. 6A illustrates examples of first EPI frame 610 and second EPI frame 620 for purposes of explanation of S420 according to some embodiments. First EPI frame 610 is in k-space and includes k-space pixels 611 through 618 located at $k_x=0$ on respective scan lines. Second EPI frame 620 is in k-space and includes k-space pixels 621 through 628 located at $k_x=0$ on respective scan lines. Because the scan lines of frame 620 are offset in the $k_y$ direction from the scan lines of frame 610 in the present example, the $k_y$ coordinates of corresponding pixels 611/621, 612/622, . . . are different.

Figure 6B:
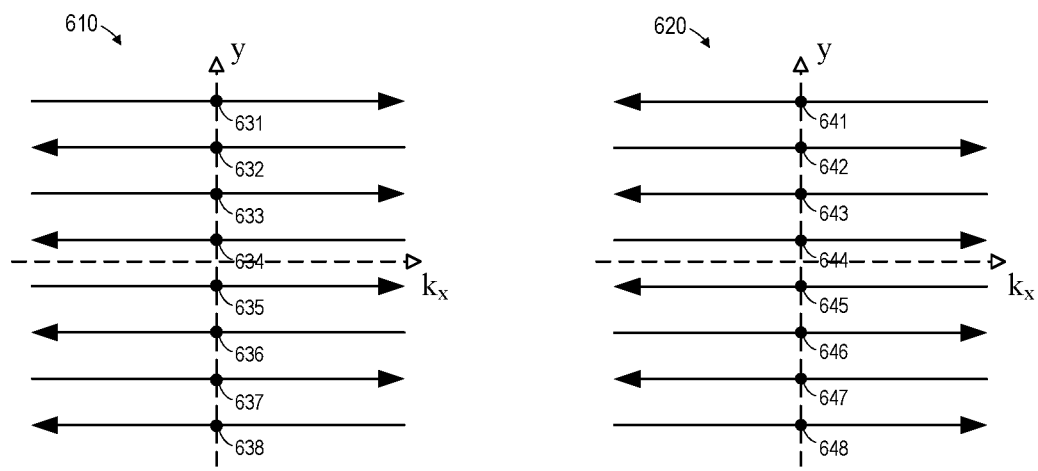
FIG. 6B represents reference frames of hybrid ($k_x$-y)-space data with opposite readout polarity.

FIG. 6B illustrates first EPI frame 610 and second EPI frame 620 after conversion to hybrid ($k_x$, y)-space at S420. Pixels 631 through 638 are located at $k_x=0$ and at y-coordinates resulting from the Fourier transform along $k_y$ of pixels 611 through 618 of frame 610 of FIG. 6A. Pixels 641 through 648 are also located at $k_x=0$ and at y-coordinates resulting from the Fourier transform along $k_y$ of pixels 621 through 628 of frame 610 of FIG. 6A. It should be noted that, due to the Fourier transform, there is no 1-to-1 correspondence between pixels 611-618 and pixels 631-638, or between pixels 621-628 and pixels 641-648.

Next, at S425, a phase relationship is determined between a line $k_x=i$ in the first hybrid ($k_x$, y)-space data and a line $k_x=i$ in the second hybrid ($k_x$, y)-space data. i=0 in some embodiments due to the presence of maximum signal strength at that location. Embodiments are also not limited to hybrid-space lines having a same $k_x$ coordinate.

With reference to FIG. 6B, S425 may include determination of a phase difference between pixel 631 and pixel 641, both located at a same y-coordinate. In this regard, the y-coordinate of each pixel may be associated with a complex value having imaginary and real components and which may therefore be represented by a magnitude and a phase. S425 may include determination of the phase of each pixel of the pair and determination of the difference between the two phases. This determination occurs for each other pair of pixels located at same y-coordinates (e.g., 632/642, 633/643, . . . ) The determined phase differences may be plotted on a y-position vs. phase difference graph.

Figure 7:
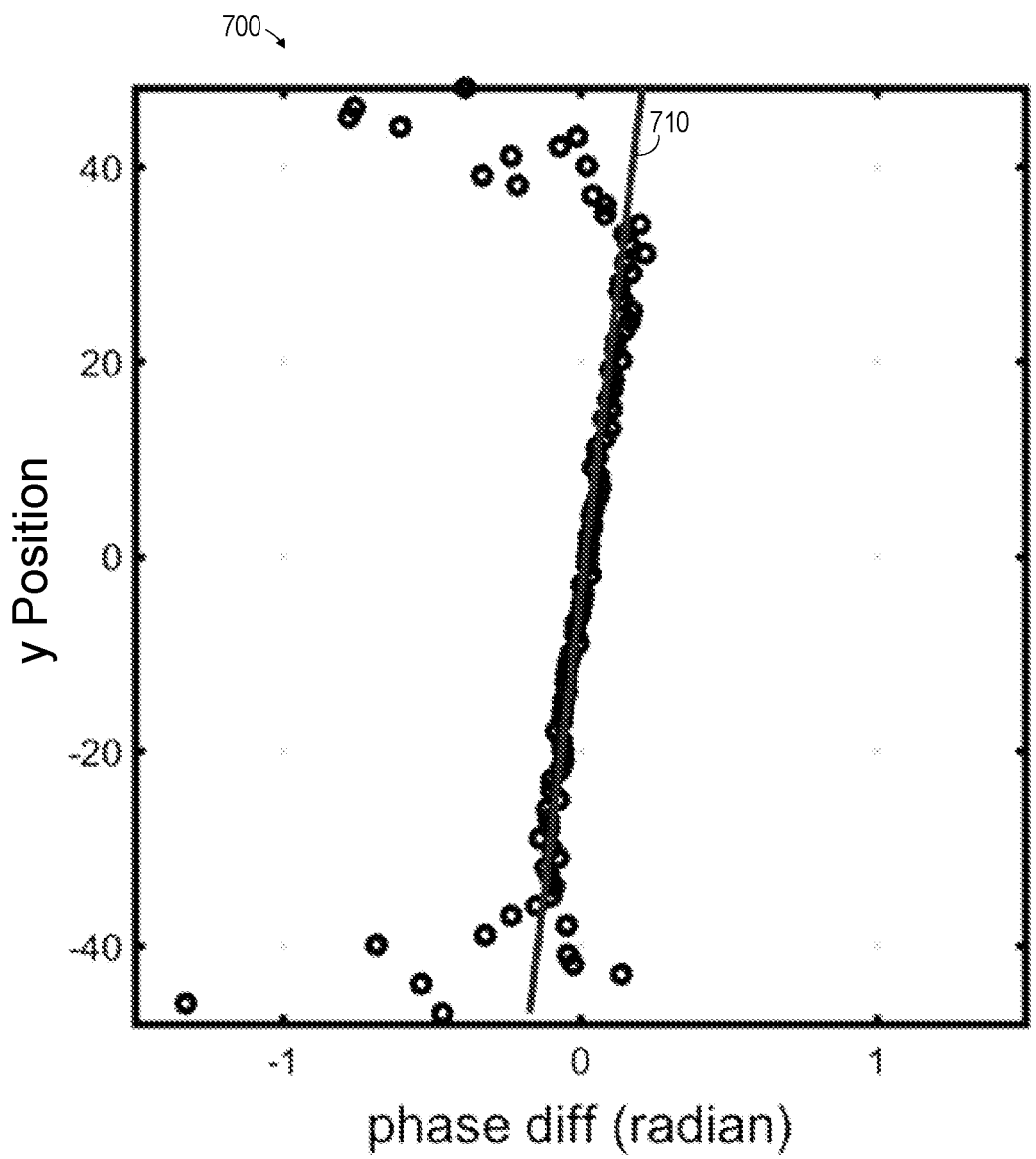
FIG. 7 is a plot of image pixel phase difference versus y-coordinate according to some embodiments.

FIG. 7 shows plot 700 of phase difference versus y-position according to some embodiments. Referring to the FIG. 6B example, one point of plot 700 is located at a coordinate representing the phase difference between pixel 635 and pixel 645, and the common y-position of pixels 635 and 645. Similarly, another point of plot 700 is located at a coordinate representing the phase difference between pixel 637 and pixel 647, and the common y-position of pixels 637 and 647.

Fitted line 710 indicates a relationship determined between the phase difference and y-position of the two lines based on the plotted points. The relationship determined at S425 may indicate phase difference as a function of y-position and may be determined via linear regression or other technique known in the art. The relationship is not limited to a linear relationship.

The determined relationship indicates the amount of phase offset between the two acquired k-spaces. Since the phase offset is solely due to the gradient pulses preceding one complete EPI acquisition, the shift in k-space is the result of unaccounted-for gradient imperfections. Examples of such gradient imperfections include cross-term eddy currents and concomitant field. The determined k-space offset therefore provides information concerning system gradient performance.

Next, at S430, and for each pixel of the second hybrid ($k_x$, y)-space data, a phase correction is applied based on a y-position of the pixel and the relationship determined at S45. According to one example of S430, a pixel of second hybrid ($k_x$, y)-space data 620 of FIG. 6B is acquired and its y-position is determined. The y-position is used to determine a phase difference from a corresponding pixel (i.e., at the same y-position) of hybrid ($k_x$, y)-space data 610 of FIG. 6B based on the relationship determined at S425. For example, in a case that the relationship is a linear relationship governed by a linear equation, the determined y-position is substituted into the linear equation to solve for phase difference. The phase of the subject pixel of second hybrid ($k_x$, y)-space data 620 is then modified to correct for this phase difference. In one example, if the determined phase difference is 0.1 radian, the phase of the pixel is reduced by 0.1 radian at S430. The foregoing process is applied to each image pixel of the second hybrid ($k_x$, y)-space data.

In some embodiments, both the first hybrid ($k_x$, y)-space data and the second hybrid ($k_x$, y)-space data may be phase-corrected at S430. With respect to the prior example in which the determined phase difference is 0.1 radian, the phase of the pixel of the second hybrid ($k_x$, y)-space data may be reduced by 0.05 radian while the phase of the corresponding pixel of the first hybrid ($k_x$, y)-space data may be increased by 0.05 radian. In this regard, S430 may employ any data modifications which result in correcting the relative phase difference between the pixels of the first hybrid ($k_x$, y)-space data and the second hybrid ($k_x$, y)-space data.

The now-corrected second hybrid ($k_x$, y)-space data is converted to k-space at S435 to generate a corrected second EPI frame. If both the first hybrid ($k_x$, y)-space data and the second hybrid ($k_x$, y)-space data were corrected at S430, S435 also includes conversion of the corrected first hybrid ($k_x$, y)-space data to k-space to generate a corrected first EPI frame. Conversion to k-space at S435 may comprise an inverse Fourier transform along the y-axis. Because a phase shift in y-space corresponds to a translational shift in $k_y$-space, modification of the image pixel phases at S430 results in movement of corresponding k-space pixels of the acquired second EPI frame such that scan lines of the corrected second EPI frame align with corresponding scan lines of the first EPI frame.

Two single-readout polarity k-space frames are generated at S440 based on the first EPI frame and the corrected second EPI frame (or, based on the first corrected EPI frame and the corrected second EPI frame if both were generated at S435). Due to the now-aligned scan lines of the two EPI frames, the two single-readout polarity k-space frames may include equally-spaced scan lines as shown with respect to data sets 220 and 230 of FIG. 2B.

Figure 8:
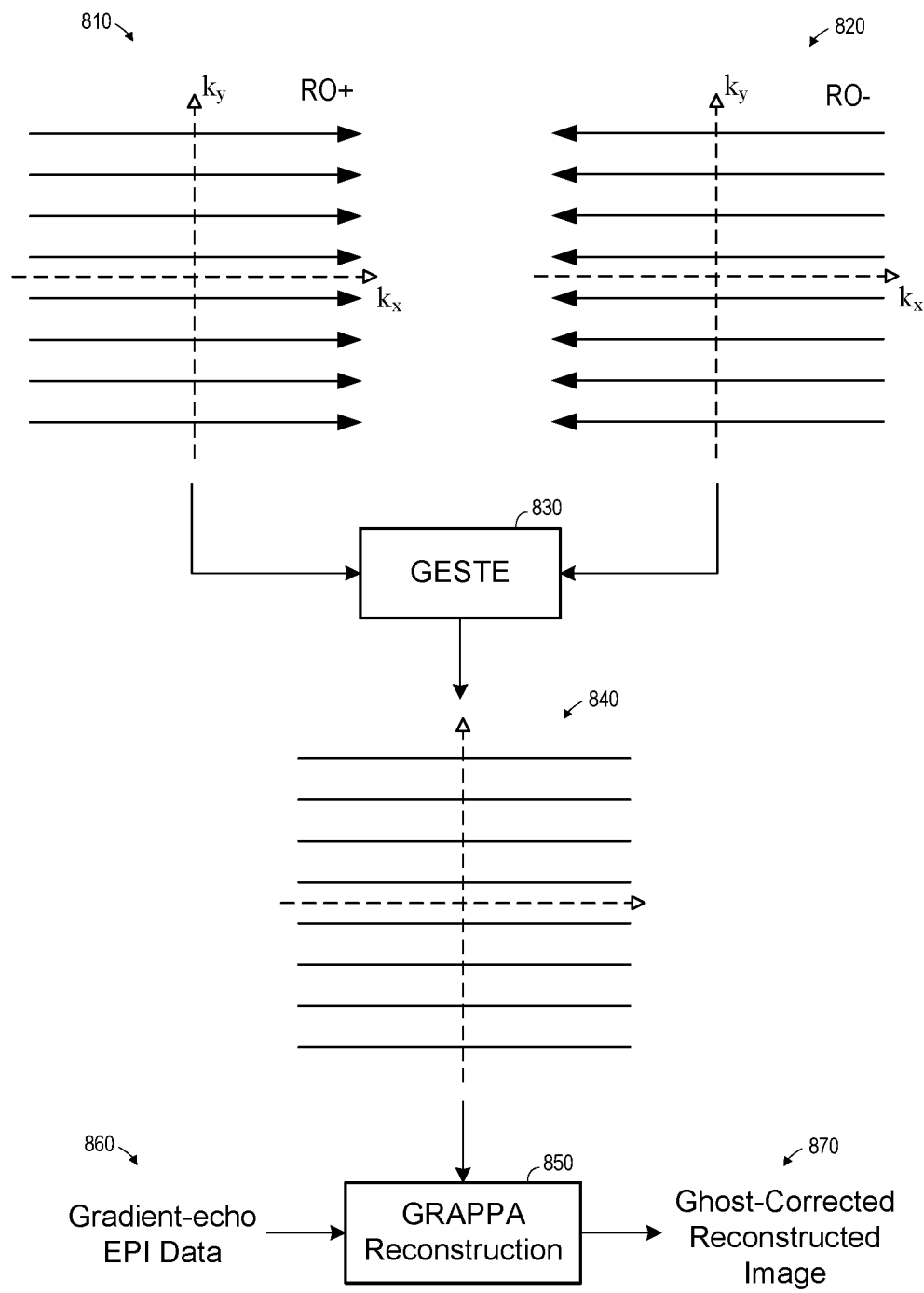
FIG. 8 illustrates ghost correction of EPI data using two single-polarity k-space space images synthesized according to some embodiments.

According to some embodiments, EPI image data is corrected at S455 based on the two single-readout polarity k-space frames generated at S450. Correction at S455 may include ghost correction of the EPI image data, before or during image reconstruction. FIG. 8 illustrates data correction at S455 according to some embodiments.

FIG. 8 includes aligned k-space data sets 810 and 820. It may be assumed that data set 820 was corrected as described above in order to align the k-space scan lines of data set 820 with the k-space scan lines of data set 810. Data sets 810 and 820 are input to GESTE processor 830, which generates optimized k-space frame 840 therefrom. Frame 840 is used as a parallel-imaging calibration target to train kernels of dual-polarity GRAPPA reconstruction processor 850. Consequently, the kernels are trained to simultaneously perform ghost correction and GRAPPA reconstruction.

Thusly-trained dual-polarity GRAPPA reconstruction processor 850 may receive subsequently-acquired gradient-echo EPI data 860. Gradient-echo EPI data 860 may be acquired using the MR system as used to obtain k-space data sets 810 and 820. GRAPPA reconstruction processor 850 performs reconstruction on gradient-echo EPI data 860 using the trained kernels to generate ghost-corrected reconstructed image 870.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:
1. A system comprising:
 a chassis defining a bore;
 a main magnet to generate a polarizing magnetic field within the bore;
 a gradient system to apply a gradient magnetic field to the polarizing magnetic field;
 a radio frequency system to transmit RF pulses to an object disposed within the bore and to receive signals from the object; and a computing system to execute program code to:
acquire a first frame of k-space data using a first initial readout polarity;
acquire a second frame of k-space data using a second initial readout polarity opposite to the first initial readout polarity;
convert the first frame of k-space data to first hybrid ($k_x$, y)-space data;
convert the second frame of k-space data to second hybrid ($k_x$, y)-space data;
determine a relationship between phase difference and y-position based on phase differences between a plurality of pixels located at $k_x$=a of first hybrid ($k_x$, y)-space data and a plurality of pixels at $k_x$=b of second hybrid ($k_x$, y)-space data, where a and b are constants;
modify the second hybrid ($k_x$, y)-space data based on the relationship;
convert the modified second hybrid ($k_x$, y)-space data to a modified second frame of k-space data; and
generate two single-polarity readout k-space frames based on the first frame of k-space data and the modified second frame of k-space data.

2. A system according to claim 1, wherein determination of the relationship comprises:
identification of a plurality of pairs of hybrid ($k_x$, y)-space pixels, where each pair includes a pixel of the first hybrid ($k_x$, y)-space data and a pixel of the second hybrid ($k_x$, y)-space data located at a same y-position; and
determination of a phase difference between the pixels of each pair of the plurality of pairs.

3. A system according to claim 2, wherein a=b=0.

4. A system according to claim 2, wherein a does not equal b.

5. A system according to claim 1, wherein modifying the second hybrid ($k_x$, y)-space data based on the relationship comprises:
determining a phase correction associated with each pixel of the second hybrid ($k_x$, y)-space data based on the relationship and the y-position of the pixel; and
for each pixel of the second hybrid ($k_x$, y)-space data, applying the associated phase correction to the pixel to generate corrected second hybrid ($k_x$, y)-space data.

6. A system according to claim 1, the computing system to execute program code to:
correct a third frame of EPI image data based on the two single-readout polarity k-space frames.

7. A system according to claim 1, the computing system to execute program code to:
phase-correct the first frame of k-space data and the second frame of k-space data in the $k_x$-direction.

8. A method comprising:
acquiring a first frame of k-space data using a first initial readout polarity;
acquiring a second frame of k-space data using a second initial readout polarity opposite to the first initial readout polarity;
converting the first frame of k-space data to first hybrid ($k_x$, y)-space data;
converting the second frame of k-space data to second hybrid ($k_x$, y)-space data;
determining a relationship between phase difference and y-position based on phase differences between a plurality of pixels located at $k_x$=a of first hybrid ($k_x$, y)-space data and a plurality of pixels at $k_x$=b of second hybrid ($k_x$, y)-space data, where a and b are constants;
modifying the second hybrid ($k_x$, y)-space data based on the relationship;
converting the modified second hybrid ($k_x$, y)-space data to a modified second frame of k-space data; and
generating two single-polarity readout k-space frames based on the first frame of k-space data and the modified second frame of k-space data.

9. A method according to claim 8, wherein determining the relationship comprises:
identifying a plurality of pairs of hybrid ($k_x$, y)-space pixels, where each pair includes a pixel of the first hybrid ($k_x$, y)-space data and a pixel of the second hybrid ($k_x$, y)-space data located at a same y-position; and
determining a phase difference between the pixels of each pair of the plurality of pairs.

10. A method according to claim 9, wherein a=b=0.

11. A method according to claim 9, wherein a does not equal b.

12. A method according to claim 8, wherein modifying the second hybrid ($k_x$, y)-space data based on the relationship comprises:
determining a phase correction associated with each pixel of the second hybrid ($k_x$, y)-space data based on the relationship and the y-position of the pixel; and
for each pixel of the second hybrid ($k_x$, y)-space data, applying the associated phase correction to the pixel to generate corrected second hybrid ($k_x$, y)-space data.

13. A method according to claim 8, further comprising:
correcting a third frame of EPI image data based on the two single-readout polarity k-space frames.

14. A method according to claim 8, further comprising:
phase-correcting the first frame of k-space data and the second frame of k-space data in the $k_x$-direction.

15. A computing system comprising:
a memory storing processor-executable program code; and
one or more processors to execute the program code to:
convert a first frame of k-space data acquired using a first initial readout polarity to first hybrid ($k_x$, y)-space data;
convert a second frame of k-space data acquired using a second initial readout polarity to second hybrid ($k_x$, y)-space data;
determine a relationship between phase difference and y-position based on phase differences between a plurality of pixels located at $k_x$=a of first hybrid ($k_x$, y)-space data and a plurality of pixels at $k_x$=b of second hybrid ($k_x$, y)-space data, where a and b are constants;
modify the second hybrid ($k_x$, y)-space data based on the relationship;
convert the modified second hybrid ($k_x$, y)-space data to a modified second frame of k-space data;
generate two single-polarity readout k-space frames based on the first frame of k-space data and the modified second frame of k-space data; and
correct a third frame of EPI image data based on the two single-readout polarity k-space frames.

16. A computing system according to claim 15, wherein determination of the relationship comprises:
identification of a plurality of pairs of hybrid ($k_x$, y)-space pixels, where each pair includes a pixel of the first hybrid ($k_x$, y)-space data and a pixel of the second hybrid ($k_x$, y)-space data located at a same y-position; and
determination of a phase difference between the pixels of each pair of the plurality of pairs.

17. A computing system according to claim 16, wherein a=b=0.

18. A computing system according to claim 16, wherein a does not equal b.

19. A computing system according to claim 15, wherein modification of the second hybrid ($k_x$, y)-space data based on the relationship comprises:
   determination of a phase correction associated with each pixel of the second hybrid ($k_x$, y)-space data based on the relationship and the y-position of the pixel; and
   for each pixel of the second hybrid ($k_x$, y)-space data, application of the associated phase correction to the pixel to generate corrected second hybrid ($k_x$, y)-space data.

20. A computing system according to claim 15, the one or more processors to execute the program code to:
   phase-correct the first frame of k-space data and the second frame of k-space data in the $k_x$-direction.

* * * * *